(12) United States Patent
Lee

(10) Patent No.: US 7,501,825 B2
(45) Date of Patent: Mar. 10, 2009

(54) MAGNETIC RESONANCE IMAGING METHOD AND SYSTEM

(75) Inventor: Ray F. Lee, New York, NY (US)

(73) Assignee: New York University, New York, NY (US)

( * ) Notice: Subject to any disclaimer, the term of this patent is extended or adjusted under 35 U.S.C. 154(b) by 49 days.

(21) Appl. No.: 11/367,235

(22) Filed: Mar. 2, 2006

(65) Prior Publication Data

US 2006/0197633 A1 Sep. 7, 2006

Related U.S. Application Data

(60) Provisional application No. 60/658,139, filed on Mar. 2, 2005.

(51) Int. Cl.
*G01V 3/00* (2006.01)
(52) U.S. Cl. ...................... 324/322; 324/318
(58) Field of Classification Search ......... 324/300–322; 600/407–455
See application file for complete search history.

(56) References Cited

U.S. PATENT DOCUMENTS

| | | | | |
|---|---|---|---|---|
| 6,249,121 | B1 * | 6/2001 | Boskamp et al. | 324/318 |
| 6,411,090 | B1 * | 6/2002 | Boskamp | 324/318 |
| 6,633,161 | B1 * | 10/2003 | Vaughan, Jr. | 324/318 |
| 6,636,039 | B1 * | 10/2003 | Nistler | 324/318 |
| 6,788,059 | B2 * | 9/2004 | Lee et al. | 324/319 |
| 6,995,561 | B2 * | 2/2006 | Boskamp et al. | 324/318 |

OTHER PUBLICATIONS

Lee RF, Hardy CJ, Sodickson DK, and Bottomley PA. "A Lumped-Element Planar Strip Array (LPSA) for Parallel MRI," *Magnetic Resonance in Medicine* 2004; 51:172-183.
Hayes CE, Edelstein WA, Schenck JF, Mueller OM, and Eash M., "An Efficient, Highly Homogeneous Radiofrequency Coil for Whole-Body NMR Imaging at 1.5T," *Journal of Magnetic Resonance* 1985; 63:622-628.
Vaughan JT, Hetherington HP, Otu JO, Pan JW, and Pohost GM, "High Frequency Volume Coils for Clinical NMR Imaging and Spectroscopy," *Magnetic Resonance in Medicine* 1994: 32:206-218.
Tropp J., "The Theory of the Bird-Cage Resonator," *Journal of Magnetic Resonance* 1989; 82:51-62.

(Continued)

*Primary Examiner*—Brij B Shrivastav
(74) *Attorney, Agent, or Firm*—Dorsey & Whitney LLP

(57) ABSTRACT

Apparatus, process and a volume strip array can be provided, e.g., for use in connection with magnetic resonance imaging ("MRI"). The apparatus includes an arrangement adapted to transmit a signal to generate a magnetic field in a particular mode, and to receive a signal in response to the generated field in another mode. In particular, a plurality of parallel conductor strips are provided in a cylindrical configuration. The conductor strips are each adapted to receive current to generate a magnetic field. In addition, a cylindrical conductive shield can be provided which can include or allow the placement of the conductive strip. A plurality of ports may also be used, each of the ports interconnecting the conductive shield and at least one of the conductor strips. A control system may also be provided to tailor the properties of the conductive strips for particular applications.

32 Claims, 11 Drawing Sheets

OTHER PUBLICATIONS

Foo TFK, Hayes CE, and Kang Y-W, "An analytical Model for the Design of RF Resonators for MR Body Imaging," *Magnetic Resonance in Medicine* 1991; 21:165-177.

Roemer PB, Edelstein WA, Hayes CE, Souza SP, and Mueller OM, "The NMR Phased Array," *Magnetic Resonance in Medicine* 1990, 192-225.

Lee RF, Giaquinto R, and Hardy CJ, "Coupling and Decoupling Theory and Its Applications to the MRI Phased-Array," *Magnetic Resonance in Medicine* 2002; 48:203213.

Wong EC and Luh W-M, "A Multimode, Single Frequency Birdcage Coil for High Sensitivity Multichannel Whole Volume Imaging," *International Society for Magnetic Resonance in Medicine 7th Scientific Meeting*, Philadelphia, PA, USA, 1999, p. 165.

Lin F-H, Kwong KK, Belliveau JW, and Wald LL, "Sensitivity Encoded Imaging From Multiple Mode Birdcage Volume Coil," *International Society of Magnetic Resonance in Medicine 10th Scientific Meeting*, Hawaii, USA, 2002, p. 853.

Leussler C, Stimma J, and Roschmann P., "The Bandpass Birdcage Resonator Modified as a Coil Array for Simultaneous MR Acquisition," International Society of Magnetic Resonance in Medicine 5th Scientific Meeting, Vancouver, B.C., Canada, 1997.

Eagan T, Cheng YC, Kidane T, Shvartsman S, and Brown R, "RF Eigenmodes: Circulant Theory and Matrix Applications," *International Society of Magnetic Resonance in Medicine 10th Scientific Meeting*, Hawaii, USA, 2002, p. 164.

Lee, RF, Boskamp EB, Giaquinto R, Ohliger M, and Sodickson DK, "A 16-Channel Transmit/Receive Volume Lattice Array (VLA) for High Acceleration in Parallel Imaging," *Proc. 11th Intl. Soc. Magn. Reson. Med.*, Toronto, Canada, 2003, p. 467.

Roschmann P, "Analysis of Mode Spectra in Cylindrical N-Conductor Transmission Line Resonators with Expansion to Low-, High- and Band-Pass Birdcage Structures," Society of Magnetic Resonance 3rd Scientific Meeting, 1995, p. 1000.

Leifer MC, "Resonant Modes of the Birdcage Coil," Journal of Magnetic Resonance 1997, 124:51-60.

Joseph PM and Lu D, "A Technique for Double Resonant Operation of Birdcage Imaging Coils," IEEE Trans. on Medical Imaging 1989, 8:286-294.

Sodickson DK and McKenzie CA, "A generalized approach to parallel magnetic resonance imaging," *Medical Physics* 2001, 28:1629-1643.

\* cited by examiner (a)

(b)

(a)                        (b)

MAGNETIC RESONANCE IMAGING METHOD AND SYSTEM

CROSS-REFERENCE TO RELATED APPLICATION

This application claims priority from U.S. Patent Application Ser. No. 60/658,139, filed Mar. 2, 2005, the entire disclosure of which is incorporated herein by reference.

FIELD OF INVENTION

The present invention relates generally to magnetic resonance imaging ("MRI"). More particularly, the present invention relates to mode mixing procedures and applications for MRI using a transmit/receive volume strip array, which may be configured to operate in various modes.

BACKGROUND INFORMATION

MRI volume coils and MRI phased arrays may be considered as two different types of coils. See, e.g., Lee R F, Hardy C J, Sodickson D K, and Bottomley P A. "A Lumped-Element Planar Strip Array (LPSA) for Parallel MRI," *Magnetic Resonance in Medicine* 2004; 51:172-183. The volume coils can be made of a group of conductor elements that are tightly coupled together. The elements may be coupled either by mutual inductance and end-rings in a "birdcage" layout, or by mutual inductance and shielding in a transverse electromagnetic ("TEM") resonator. See, e.g., Hayes C E, Edelstein W A, Schenck J F, Mueller O M, and Eash M., "An Efficient, Highly Homogeneous Radiofrequency Coil for Whole-Body NMR Imaging at 1.5T," *Journal of Magnetic Resonance* 1985; 63:622-628; Vaughan J T, Hetherington H P, Otu J O, Pan J W, and Pohost G M, "High Frequency Volume Coils for Clinical NMR Imaging and Spectroscopy," *Magnetic Resonance in Medicine* 1994; 32:206-218; Tropp J., "The Theory of the Bird-Cage Resonator," *Journal of Magnetic Resonance* 1989; 82:51-62; Foo T K F, Hayes C E, and Kang Y-W, "An analytical Model for the Design of RF Resonators for MR Body Imaging," *Magnetic Resonance in Medicine* 1991; 21:165-177. Volume coils can be used to generate a homogeneous magnetic field pattern in a low field, where the resonance wavelength may be much larger then an imaged object.

Phased arrays can include a group of loop or strip conductor elements that may be mutually decoupled from each other. The elements may be decoupled either by complex conjugate cancellation of impedance, by a minimum current that can be caused by high impedance at the ports of a coil, or by providing a certain distance between adjacent elements. See, e.g., Roemer P B, Edelstein W A, Hayes C E, Souza S P, and Mueller O M, "The NMR Phased Array," *Magnetic Resonance in Medicine* 1990, 192-225; Wang J., "A novel method to reduce the signal coupling of surface coils for MRI," *Proceedings of the ISMRM 4th Annual Meeting*, New York, 1996, p. 1434; Lee R F, Giaquinto R, and Hardy C J, "Coupling and Decoupling Theory and Its Applications to the MRI Phased-Array," *Magnetic Resonance in Medicine* 2002; 48:203213. Such coils can be capable of achieving both a high signal-to-noise ratio ("SNR") and a large field of view ("FOV").

Volume coils may be characterized as coupled structures, and phased arrays may be characterized as decoupled structures. A decoupled structure may be described as a totally degenerated coupled structure. Coupled volume coils and decoupled phased arrays each may include a set of tuned resonators having a certain degree of degeneracy. The volume coil structures, although they may be tightly coupled, can exhibit some degree of degeneracy. Azimuth symmetry in volume coils may lead to a certain degree of degeneracy, such that the number of resonance frequencies can be about half of the number of the elements of volume coils. The phased array structure may not be completely degenerate, although total degeneracy may be approached because of, in part, a high impedance at the receiver port that may be caused by a preamplifier. This lack of degeneracy may not be present in some phased array structures having a low input impedance preamplifier. The degree of degeneracy can be used as a measure of coupling or decoupling of a coil structure. Therefore, a volume coil may not provide a completely coupled structure, and a phased array may not provide a completely decoupled structure. Environmental factors located outside of the coils, such as impedance of receiver ports and loading, can also affect the coupling/decoupling of coils.

In the absence of degeneracy, -coupled n-element resonators may have a maximum of n resonance frequencies, which can be referred to as n basic modes. When m (1<m<n) resonance frequencies are merged into one resonance frequency in an n-element coupled structure, such a structure may be referred to as having m-degree degeneracy, and the frequency merger can be referred to as mixing modes. Birdcage coils and transverse electromagnetic resonators can be referred to as having a two-degree degenerate structure, and decoupled n-element phased arrays can be described as having an n-degree, or totally degenerate, structure.

Systems and methods that include or utilize mixing modes, such as degenerate first and second circular modes of a birdcage coil, may employ two independent coils. The imaging behavior of such systems has been observed to be insufficiently detailed. See, e.g., Wong E C and Luh W-M, "A Multimode, Single Frequency Birdcage Coil for High Sensitivity Multichannel Whole Volume Imaging," *International Society for Magnetic Resonance in Medicine 7th Scientific Meeting*, Philadelphia, Pa., USA, 1999, p. 165; Lin F-H, Kwong K K, Belliveau J W, and Wald L L, "Sensitivity Encoded Imaging From Multiple Mode Birdcage Volume Coil," *International Society of Magnetic Resonance in Medicine 10th Scientific Meeting*, Hawaii, USA, 2002, p. 853.

The use of two completely degenerate modes in birdcage resonators was experimentally achieved in some birdcage coils having a small number of elements, and has been observed to provide improved imaging results. See, e.g., Tropp J, "The Hybrid Birdcage Resonator," *Society of Magnetic Resonance in Medicine 11th Scientific Meeting*, 1992, p. 4009; Leussler C, Stimma J, and Roschmann P., "The Bandpass Birdcage Resonator Modified as a Coil Array for Simultaneous MR Acquisition," International Society of Magnetic Resonance in Medicine 5th Scientific Meeting, Vancouver, B.C., Canada, 1997; Eagan T, Cheng Y C, Kidane T, Shvartsman S, and Brown R, "RF Eigenmodes: Circulant Theory and Matrix Applications," *International Society of Magnetic Resonance in Medicine 10th Scientific Meeting*, Hawaii, USA, 2002, p. 164.

MRI coils, including volume coils and phased arrays such as those described above, may suffer from certain performance deficiencies. Such deficiencies may include a low signal-to-noise ratio, inefficient power consumption, and poor imaging behavior in parallel modes.

OBJECTS AND SUMMARY OF EXEMPLARY EMBODIMENTS OF INVENTION

Certain exemplary embodiments of the present invention provide methods and systems for achieving improved MRI results. An apparatus or arrangement may be provided to transmit a signal and generate a magnetic field in a particular mode, and to receive a signal in response to the generated field in a second mode.

In a further exemplary embodiment of the present invention, the second receive mode may be the same as, or substantially similar to, the transmit mode.

According to exemplary embodiments of the present invention, an apparatus may be provided that includes a coil arrangement having a plurality of coils, and a configurable control arrangement that allows a reflection factor at one end of the coils to be adjusted, which can allow the apparatus to receive different modes. In certain exemplary embodiments, the reflection factor may be adjusted at both ends of the coils.

In a further exemplary embodiment of the present invention, the apparatus can be configured so that the received signal may be coupled or decoupled. In further exemplary embodiments of the present invention, the control arrangement may be capable of adjusting a phase and/or an amplitude of the transmitted signal.

In still further exemplary embodiments of the present invention, the coil arrangement may include linear conductors, which may be arranged parallel to each other. The linear conductors may be arranged on a cylindrical surface or base. The apparatus may further include a cylindrical conductive shield that may surround part or all of the linear conductors, and which can provide a resonant structure. The resonant structure may be tuned to a particular resonant frequency. The apparatus may be configured as a transmit/receive volume strip array, which can include a multiple-port circularly symmetric coil structure.

These and other objects, features and advantages of the present invention will become apparent upon reading the following detailed description of embodiments of the invention, when taken in conjunction with the appended claims.

BRIEF DESCRIPTION OF THE DRAWINGS

Further objects, features and advantages of the invention will become apparent from the following detailed description taken in conjunction with the accompanying figures showing illustrative embodiments of the invention, in which:

FIG. 7(a) is a further exemplary plot of the real part of $Z_r(p)$ in port-space for a 16-element VSA;

FIG. 7(b) is a further exemplary plot of the imaginary part of $Z_r(p)$ in port-space for a 16-element VSA;

FIG. 7(c) is a further exemplary plot of the real part of the IMD diag $\{\psi+Zg\}$ in mode-space for a 16-element VSA;

FIG. 9(*b*) shows an exemplary image obtained from the 16-element VSA that is tuned to its first circular mode and configured to transmit/receive with only the 0th and 4th ports;

FIG. 11(*b*) shows an exemplary image produced without under-sampling in a phased encoding direction corresponding to the sensitivity maps shown in FIG. 11(*a*); and FIG. 11(*c*) shows an exemplary image produced with under-sampling along two dimensions and a reduction factor of 16 (4×4), corresponding to the sensitivity maps shown in FIG. 11(*a*).

Figure 1:
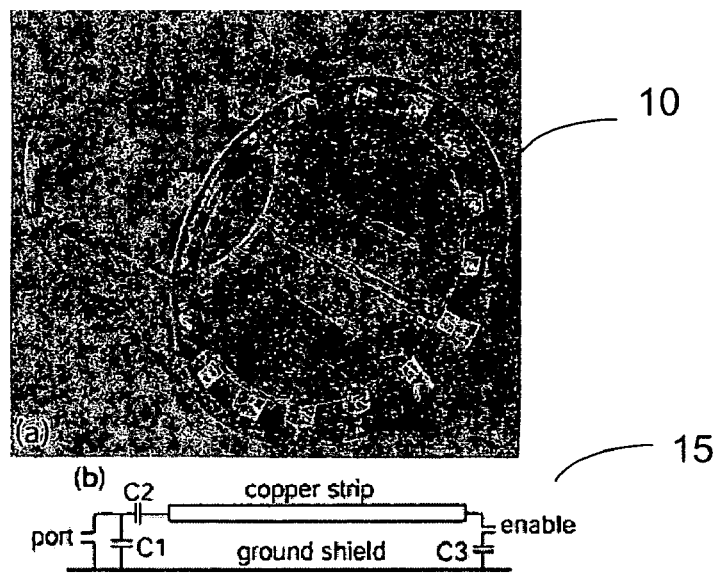
FIG. 1(a) is an exemplary photograph of a 16-element VSA structure according to an exemplary embodiment of the present invention.
FIG. 1(b) is a circuit diagram of an exemplary element of the VSA structure of FIG. 1(a)

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION OF EXEMPLARY EMBODIMENTS OF INVENTION

According to an exemplary embodiment of the present invention, a mode mixing theory can be developed to characterize the relation between a mode distribution, a mutual coupling, and an external port impedance in a circular symmetric volume strip array. The impedance matrix of a circular symmetric VSA may be a circulant matrix. Because a circulant matrix can be diagonalized by a Digital Fourier Transform ("DFT") matrix, mode distributions may be expressed as a Fourier transform of mutual coupling. Thus, an exemplary provision of a specific mixed mode can be similar or equivalent to manipulating the mutual coupling of a VSA. One type of mixed mode, a reverse-decoupled mode (RDM), can be viewed as a difference between a homogeneous mode and a decoupled mode. This mode may provide improved performance for parallel imaging.

A typical n-element VSA may include n conductor strips inside of a cylindrical conductive shield. FIG. 1A is a photograph of an exemplary 16-element VSA structure 10. FIG. 1(*b*) is an exemplary schematic circuit diagram of a single element 15 of the VSA 10. In one exemplary embodiment of the present invention, each element may be tuned to a common frequency and matched to a common impedance, while the rest of elements are disabled, by employing shunted and series capacitors C1, C2, and C3 as shown in FIG. 1(*b*). When all elements are enabled simultaneously, either coupled or decoupled, the desired mode frequency may be at the MR frequency. The port impedances in certain exemplary embodiments of the present invention may all be, e.g., at 50Ω.

For an n-element VSA structure, the voltages and currents on n ports may be provided as vector V(p) and I(p), respectively, where p=0, 1, . . . , n−1 can be defined as a port index. The voltages and currents for n modes may be written as vectors $V^m(k)$ and $I^m(k)$, respectively, where k=0, 1, . . . , n−1 can be defined as a mode index. Because VSA is a cyclic symmetric structure, its impedance matrix can be an n×n circulant matrix Z. Circulant matrices such as Z can be diagonalized to ψ by using a DFT matrix F, $$Z = F^*\psi F, \qquad [1]$$

where $$Z = \begin{pmatrix} Z_{00} & Z_{01} & \cdots & Z_{0(n-1)} \\ Z_{10} & Z_{11} & \cdots & Z_{1(n-1)} \\ \cdots & \cdots & \cdots & \cdots \\ Z_{(n-1)0} & Z_{(n-1)1} & \cdots & Z_{(n-1)(n-1)} \end{pmatrix},$$

$$F = \begin{pmatrix} 1 & 1 & \cdots & 1 \\ 1 & W^1 & \cdots & W^{(n-1)} \\ \cdots & \cdots & \cdots & \cdots \\ 1 & W^{(n-1)} & \cdots & W^{(n-1)(n-1)} \end{pmatrix},$$

and $$\Psi = \begin{pmatrix} \psi_0 & 0 & \cdots & 0 \\ 0 & \psi_1 & \cdots & 0 \\ \cdots & \cdots & \cdots & \cdots \\ 0 & 0 & \cdots & \psi_{n-1} \end{pmatrix},$$

and where $F^*$ is the adjoint matrix of F, and $W=e^{-j2\pi/n}$. See, e.g., Lee R F, Boskamp E B, Giaquinto R, Ohliger M, and Sodickson D K, "A 16-Channel Transmit/Receive Volume Lattice Array (VLA) for High Acceleration in Parallel Imaging," *Proc. 11th Intl. Soc. Magn. Reson. Med.*, Toronto, Canada, 2003, p. 467.

Using the above exemplary definitions, the nodal equation for a VSA in both port-space and mode-space may be expressed as $$V(p)=ZI(p), \text{ and } V^m(k)=\psi I^m(k). \qquad [2]$$

These expressions can be consistent with the following relationships between port-space and mode space: $V^m(k)=F\,V(p)$ and $I^m(k)=F\,I(p)$. See, e.g., Paul C R, *Analysis of Multiconductor Transmission lines*, New York: John Wiley & Sons, 1994.

A concept of a reference port q may be used with the concept of an impedance matrix to better characterize a multiple port system. When the reference port q is equal to zero, the impedance matrix $Z_0$ may be the same as the matrix Z in Eq. [1] above. However, if q is not zero, then the impedance matrix Zq may be determined by up-circular-shifting rows in the impedance matrix $Z_0$ q times.

For example, if the reference port is designated as 0, the first row of $Z_0$ can be defined as a vector $Z_r(p)=(Z_{00} \ldots Z_{0p} \ldots Z_{0(n-1)})^T$. The elements of $Z_r(p)$ may be defined as the measurable self and mutual impedances between $0^{th}$ and other elements in a VSA, which are the self and mutual couplings between the $0^{th}$ and other elements observed from $0^{th}$ port. Furthermore, if the reference port is q, the first row in $Z_q$ becomes $Z_r(p-q)$ which is derived from right-circular-shift q times from $Z_r(p)$.

The diagonal term set of ψ may be expressed as a vector $\psi^d(k)$ $(\psi_0 \ldots \psi_k \ldots \psi_{n-1})^T$, where $\psi_k$ is a weighting factor of $k^{th}$ mode as indicated by Eq. [2]. Thus, $\psi^d(k)$ may be a mode distribution that is related only to the internal structure of VSA, which can be defined as an intrinsic mode distribution ("IMD") at the reference port q=0. Since Z, $Z_0$, and $Z_q$ may each be a circulant matrix, at any reference port q the relationship between IMD and $Z_r(p-q)$ can be expressed as $$\Psi_q^d(k) = \Psi^d(k) e^{-j\frac{2\pi}{n}kq} = FZ_r(p-q). \quad [3]$$

Eq. [3] describes a quantitative relation between an intrinsic mode distribution and the mutual coupling of a VSA. It can be used to determine the degree of degeneracy of a VSA structure and/or to design a VSA for a given mode distribution.

The intrinsic mode distribution, or IMD, may be determined by the internal structure of a VSA. However, the current distribution in either port space or mode space may further depend, at least in part, on external conditions such as, for example, a power distribution among the ports during transmitting operations, or an input impedance of a preamplifier during receiving operations. To include such external factors into the mode analysis, a mode-current distribution of the kth mode, Im(k), may be defined as a forced mode distribution ("FMD"). Its relation with the port-current vector, I(p), can be expressed as $$I^m(k) = FI(p) \quad [4]$$

The FMD can be used to establish a relationship between desired magnetic field maps, IMD, and transmit/receive signals. A VSA can be fully characterized by specifying both the IMD and the FMD.

The n-port port-voltage vector observed at port q may be written as V(p-q). The relationship between V(p-q) and the intrinsic and forced mode distributions (the IMD and the FMD) can be derived from the n-port system nodal equation using Eqs. [3] and [4]. This relationship may be provided as:

$$V(p-q) = Z_q I(p) \quad [5]$$

$$= F^* \Psi(k) e^{-j\frac{2\pi}{n}kq} I^m(k)$$

$$= \begin{pmatrix} 1 & 1 & \cdots & 1 \\ 1 & W^1 & \cdots & W^{(n-1)} \\ \cdots & \cdots & \cdots & \cdots \\ 1 & W^{(n-1)} & \cdots & W^{(n-1)(n-1)} \end{pmatrix}$$

$$\begin{pmatrix} \Psi_0 & 0 & \cdots & 0 \\ 0 & \Psi_1 e^{-j\frac{2\pi}{n}q} & \cdots & 0 \\ \cdots & \cdots & \cdots & \cdots \\ 0 & 0 & \cdots & \Psi_{(n-1)} e^{-j\frac{2\pi}{n}(n-1)q} \end{pmatrix} \begin{pmatrix} I_0^m \\ I_1^m \\ \cdots \\ I_{n-1}^m \end{pmatrix}$$

Based on the extended impedance definition, the IMD at each different reference port q, $\Psi_q^d(k)$, may be phased differently. This phase difference can suggest that, even if an n-element VSA is a coupled structure, the n-port signals observed at different ports may have distinguishable phases.

Common modes may be expressed by using Eq. [5], the degree of degeneracy, and the previous description of cyclic symmetric structures. See, e.g., Roschmann P, "Analysis of Mode Spectra in Cylindrical N-Conductor Transmission Line Resonators with Expansion to Low-, High- and Band-Pass Birdcage Structures," Society of Magnetic Resonance 3rd Scientific Meeting, 1995, p. 1000; Leifer M C, "Resonant Modes of the Birdcage Coil," Journal of Magnetic Resonance 1997, 124:51-60; Joseph P M and Lu D, "A Technique for Double Resonant Operation of Birdcage Imaging Coils," IEEE Trans. on Medical Imaging 1989, 8:286-294.

Modes that do not include any degeneracy may be referred to as basic modes. In IMD this one-degree degeneracy can be described as follows: If $\psi_k$, k=0, 1, . . . , or n-1, is a non-zero component in $\Psi_q^d(k)$, it will be the only non-zero component in $\Psi_q^d(k)$. For example, if the IMD can be written as $\Psi_q^d(k) = (\psi_0, 0, \ldots, 0)^T$, only the $0^{th}$ mode is non-zero. The $0^{th}$ basic mode V(p-q) is a constant distribution, which may be provided as $$V(p-q) = \Psi_0 I_0^m \begin{pmatrix} 1 \\ 1 \\ \cdots \\ 1 \end{pmatrix} \quad [6]$$

This mode represents the interaction between the conductor strips and a ground (or a shield). The $0^{th}$ basic mode is a real mode that may be observed in the shielded volume coils, usually at the lowest resonance frequency. However, this mode may not exist in the non-shielded volume coils. In this mode, the signal voltages can be uniformly distributed among all ports, and the couplings between any two ports may be the same.

If the IMD is provided as $$\Psi_q^d(k) = \left(0, \ldots, 0, \psi_k e^{-j\frac{2\pi}{n}kq}, 0, \ldots, 0\right)^T,$$

where only the $k^{th}$ mode is non-zero, then the $k^{th}$ basic mode may be expressed as a complex exponential distribution as:

$$V(p-q) = \psi_k e^{-j\frac{2\pi}{n}kq} I_k^m \begin{pmatrix} 1 \\ W^k \\ \cdots \\ W^{k(n-1)} \end{pmatrix}. \quad [7]$$

The n basic forced mode distributions can be generated by applying n power sources over n ports on a VSA during the transmit stage. However, only one or two of the basic intrinsic mode distributions (depending on whether n is even or odd) may be an observable mode on a cyclic symmetric volume coil such as, e.g., a VSA, a birdcage, or a TEM resonator. If a VSA has an odd number of elements, it may have only one observable basic IMD, viz., the 0th mode shown in Eq. [6]. If n is an even number, both the $0^{th}$ and the $(n/2)^{th}$ basic intrinsic mode distributions may be observable. The basic mode V(p-q) corresponding to k=n/2 may be provided as $$V(p-q) = \psi_{n/2} e^{j\pi q} I_{n/2}^m \begin{pmatrix} 1 \\ -1 \\ \cdots \\ (-1)^{(n-1)} \end{pmatrix}. \quad [8]$$

The V(p-q) values of the $0^{th}$ mode shown in Eq. [6] can have the same magnitudes and phases on all ports. The V(p- q) values for the $(n/2)^{th}$ mode also may have the same magnitudes. However, the phases may alternated by B at adjacent ports. Coupling between the strips and the shield can be a characteristic of the $0^{th}$ basic mode of a VSA. A characteristic of the $(n/2)^{th}$ basic mode can be the coupling between the nearest neighbor strips when the total number of strips is an even number.

The intrinsic mode distributions of a VSA may include the two basic modes shown in Eqs. [6] and [8] as provided above. In addition, the cyclic symmetry may cause a degeneracy between a $k^{th}$ mode and an $(n-k)^{th}$ mode, which can result in a "circular mode." Circular modes can refer to modes that have two degrees of degeneracy between the $k^{th}$ mode and the $(n-k)^{th}$ basic modes associated with a cyclic symmetric structure. For example, the second lowest resonance frequency in a VSA can be a circular mode which is degenerate with respect to basic modes 1 and n−1. The corresponding IMD at each different reference port q, $\Psi_q^d(k)$, may be provided as $$\left(0, \psi_1 e^{-j\frac{2\pi}{n}q}, 0, \ldots, 0, \psi_{n-1} e^{-j\frac{2\pi}{n}(n-1)q}\right)^T.$$

If most or all of the conductive strips in a VSA are equally spaced, then all of the output impedances of power may be such that $\psi_1$ may be equal to $\psi_{n-1}$ in IMD The FMD may have various values during the transmit stage. However, if the input impedances of all preamplifiers are the same, then $I_1^m = I_{n-1}^m$ during the receive stage. Therefore, based on Eq. [5], the $0^{th}$ basic mode during the receive stage, V(p−q), may be provided as:

$$V(p-q) = \psi_1 I_1^m \left[ e^{-j\frac{2\pi}{n}q} \begin{pmatrix} 1 \\ W^1 \\ \ldots \\ W^{(n-1)} \end{pmatrix} + e^{j\frac{2\pi}{n}q} \begin{pmatrix} 1 \\ W^{(n-1)} \\ \ldots \\ W^{(n-k)(n-1)} \end{pmatrix} \right] \quad [9]$$

$$= 2\psi_1 I_1^m \begin{pmatrix} \cos\left(\frac{2\pi}{n}q\right) \\ \cos\left(\frac{2\pi}{n} + \frac{2\pi}{n}q\right) \\ \vdots \\ \cos\left(\frac{2\pi}{n}(n-1) + \frac{2\pi}{n}q\right) \end{pmatrix}.$$

which includes one period of a sinusoidal distribution having a $2\pi q/n$ phase shift for the $q^{th}$ reference port. This is the same distribution as that for the homogeneous mode of a birdcage or a TEM resonator.

Any $k^{th}$ circular mode ($1<k<n/2-1$ if n is an even number, or $1<k<(n-1)/2$ if n is an odd number) can be a degeneration of the $k^{th}$ and $(n-k)^{th}$ basic modes. Based on Eq. [5], the $0^{th}$ basic mode during the receive stage, V(p−q), may be provided as:

$$V(p-q) = \psi_k I_k^m \left[ e^{-j\frac{2\pi}{n}kq} \begin{pmatrix} 1 \\ W^k \\ \ldots \\ W^{k(n-1)} \end{pmatrix} + e^{j\frac{2\pi}{n}kq} \begin{pmatrix} 1 \\ W^{(n-k)} \\ \ldots \\ W^{(n-k)(n-1)} \end{pmatrix} \right] \quad [10]$$

$$= 2\psi_k I_k^m \begin{pmatrix} \cos\left(\frac{2\pi}{n}kq\right) \\ \cos\left(k\frac{2\pi}{n} + \frac{2\pi}{n}kq\right) \\ \ldots \\ \cos\left(k\frac{2\pi}{n}(n-1) + \frac{2\pi}{n}kq\right) \end{pmatrix}.$$

Here, V(p−q) can have k periods of a sinusoidal distribution with a $2\pi kq/n$ phase shift for the $q^{th}$ reference port. Also, $\psi_k = \psi_{n-k}$ and $I_k^m = I_{n-k}^m$ for the same reasons stated in the first circular mode case described above.

If the magnetic field intensity is relatively low (about 1.5 T or less), Eqs. [6], [8] and [10] above may be used to describe the signal voltage distributions on the ports of a VSA for both basic modes and circular modes. The n basic modes in the VSA may be degenerated into (n/2+1) modes if n is even number, or (n+1)/2 if n is odd number. A birdcage and a TEM resonator can have similar mode structures (although a birdcage does not have a $0^{th}$ mode because it has no shield).

If all of the n basic modes of a VSA are degenerated into a single mode, this phenomenon may be referred to as total degeneracy, or n degree degeneracy. The single mode can be referred to as a decoupled mode, and it may be the same mode as that of a phased array of a conventional MRI. The IMD of a totally degenerate configuration may be a constant distribution, i.e., $\psi_0 = \psi_1 = \ldots = \psi_{n-1}$. The FMD can have various forms during the transmit stage. For the receive function, if the input impedances of the preamplifiers are equal, the FMD may also be a constant distribution, so that $I_0^m = I_1^m = \ldots = I_{n-1}^m$. Thus, the 0th basic mode during the receive stage, V(p−q), may be provided as:

$$V(p-q) = \psi_0 I_0^m F * \begin{pmatrix} 1 \\ e^{-j\frac{2\pi}{n}q} \\ \ldots \\ e^{-j\frac{2\pi}{n}(n-1)q} \end{pmatrix} = \psi_0 I_0^m n \begin{pmatrix} \delta(p-q) \\ \delta(p-q) \\ \ldots \\ \delta(p-q) \end{pmatrix}. \quad [11]$$

In the present exemplary case, δ(p−q) is the delta function, which is equal to unity when p=q, and is equal to zero when p≠q. Equation [11] suggests that any reference port may be completely isolated from the other ports.

In contrast to quadrature volume coils, the modes and/or mode distributions for the transmitting and receive stages in a VSA can be quite different. For the transmit stage, a variety of modes may be generated by manipulating external power sources, and the transmitting efficiency can be determined largely by the IMD. However, for the receive stage, the modes may be determined primarily by the IMD.

During the transmit stage, signal generators can serve as external power sources, and the transmitting design equation may be provided as:

$$I^m(k) = (\psi + Z^g)^{-1} F V^g(p) = (\psi + Z^g)^{-1} V^{gm}(k). \quad [12]$$

Here, the voltage vector of an external power sources is denoted by $V^g(p)$ in port-space, and $V^{gm}(k) = F V^g(p)$ in mode-space, and $Z^g$ is a diagonal matrix whose diagonal terms are the impedances of the external power sources. These impedances may have a value of approximately 50Ω.

During the receive stage, the signal generators can provide the currents induced in the conductive strips of the VSA. The design equation for the receive stage may be written as:

$$V^m(k) = (\psi + Z^p) F I^p) = (\psi + Z^p) I^m(k). \qquad [13]$$

Here, $Z^p$ is a diagonal matrix and the diagonal terms are the transformed input impedances of the preamplifiers at the ports of the VSA.

The design equations can be expressed in either port-space or mode-space. The equations may have a simpler form in mode-space, as described in Eqs. [12] and [13] above, because $(\psi+Z^g)^{-1}$ and $\psi+Z^p$ can be diagonal matrices that can allow decoupling of the relationship between voltages and currents. The form of Eqs. [12] and [13] suggests that for the transmit stage, the external power sources $V^g(p)$ and/or $V^{gm}(k)$ can affect or govern the FMD, whereas the IMD may only affect the power efficiency and magnetic field pattern. For the receive stage, the mode distribution may be primarily determined by the IMD. which can result from the mutual coupling in the VSA.

Figure 2:
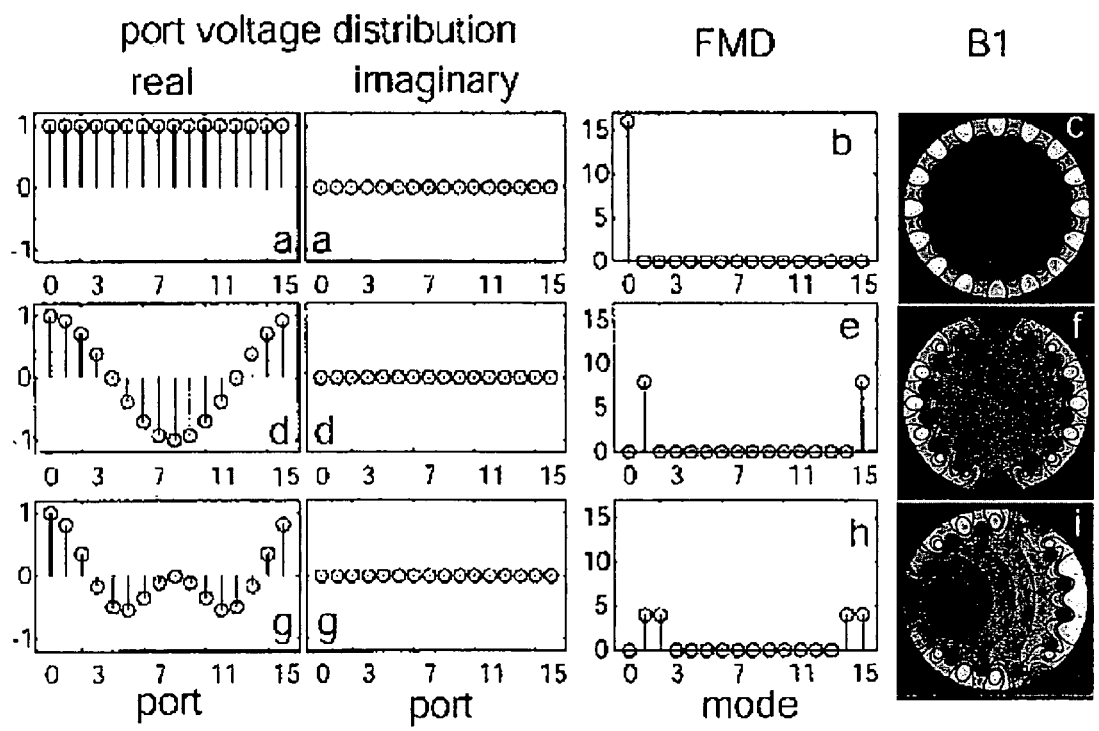
FIG. 2(a) is an exemplary graph of real and imaginary components of a VSA port voltage distribution for a $0^{th}$ basic mode.
FIG. 2(b) is an exemplary graph of a forced mode distribution corresponding to the port voltage distribution of FIG. 2(a)
FIG. 2(c) is an exemplary magnetic field B1 map corresponding to the port voltage distribution of FIG. 2(a)
FIG. 2(d) is an exemplary graph of real and imaginary components of the VSA port voltage distribution for a first circular mode.
FIG. 2(e) is an exemplary graph of a forced mode distribution corresponding to the port voltage distribution of FIG. 2(d)
FIG. 2(f) is an exemplary magnetic field B1 map corresponding to the port voltage distribution of FIG. 2(d)
FIG. 2(g) is an exemplary graph of real and imaginary components of the VSA port voltage distribution for a degenerate of first and second circular modes.
FIG. 2(h) is an exemplary graph of a forced mode distribution corresponding to the port voltage distribution of FIG. 2(g)
FIG. 2(i) is an exemplary magnetic field B1 map corresponding to the port voltage distribution of FIG. 2(g)

The IMD of a VSA in a decoupled mode may be a constant distribution. Application of Eq. [12] suggests that the corresponding FMD may have the same distribution as the mode-voltage $V^{gm}(k)$, which is a digital Fourier transform (DFT) of $V^g(p)$. Thus, the modes of excitation can be determined by the arrangement of external power sources. Three examples of this are shown in FIG. 2.

The first example corresponds to all components of $V^g(p)$ having the same amplitude and zero phase, such that the corresponding FMD may be the $0^{th}$ basic mode. As described above, the magnetic field in this mode can be concentrated between the conductive strips and the shield, which can lead to a poor transmission efficiency. FIGS. 2(a), 2(b) and 2(c) show a normalized $V^g(p)$, an FMD, and a transmission magnetic field, respectively, corresponding to this $0^{th}$ basic mode.

In the second example, $V^g(p)$ has one period of a sinusoidal distribution in amplitude and zero phase differences. The corresponding FMD is the first circular mode. The $V^g(p)$, FMD, and transmission magnetic field for this example are shown in FIGS. 2(d), 2(e) and 2(f), respectively. This example is one of the natural modes of a VSA which may be generated by one or two port excitations if the VSA is turned to its first circular mode. However, in a decoupled VSA it may require an array of power sources having a sinusoidal amplitude distribution. Therefore, a decoupled VSA may not be an optimal choice for generating a homogeneous excitation. However, an arbitrary mixed mode excitation may be achieved easily with a decoupled VSA. For a specified FMD, the corresponding mode-voltage vector $V^{gm}(k)$ may be proportional to the FMD. The relative amplitudes and phases of the power source array can be obtained as the digital Fourier transform of the $V^{gm}(k)$ vector.

As a third example, if the desired FMD is the degenerate of first and $2^{nd}$ circular modes as shown in FIG. 2(h), then the power sources $V^g(p)$ should be set to those shown in FIG. 2(g), and the corresponding transmission magnetic field is shown in FIG. 2(i).

A coupled n-element circular symmetric VSA may have two basic modes and n/2−1 circular modes. Although any one of these coupled modes can be tuned to an MRI resonance frequency, the VSA may only have efficient magnetic field penetration when it is in the first circular mode, as described below.

Unlike the decoupled mode described above, the IMD of a coupled VSA in a first circular mode may not be a constant distribution. The inverse of the extended IMD $\psi+Z^d$ in Eq. [12] during the transmit stage may be provided as:

$$(\Psi + Z^g)^{-1} = \begin{pmatrix} 1/Z^g & 0 & 0 & \cdots & 0 & 0 \\ 0 & 1/(\psi_1 + Z^g) & 0 & \cdots & 0 & 0 \\ 0 & 0 & 1/Z^g & \cdots & 0 & 0 \\ \cdots & \cdots & \cdots & \cdots & \cdots & \cdots \\ 0 & 0 & 0 & \cdots & 1/Z^g & 0 \\ 0 & 0 & 0 & \cdots & 0 & 1/(\psi_{n-1} + Z^g) \end{pmatrix}. \qquad [14]$$

For a coupled VSA, the effect of the IMD on the FMD, if any, can depend on what types of modes may be desired. For example, all of the basic modes and all of the circular modes may be achieved by appropriately arranging the power sources. For example, if the power sources each have a constant distribution $V^g(p)=(V_0^g, V_0^g, \ldots, V_0^g)$, a complex exponential distribution $V^g(p)=(V_0^g, V_0^g e^{j(2\pi/n)}, \ldots, V_0^g e^{j(2\pi/n)(n-1)})$, or a sinusoidal distribution $V^g(p)=(V_0^g, V_0^g \cos(2\pi/n), \ldots, V_0^g \cos(2\pi(n-1)/n))$, then the mode-voltages become a $0^{th}$ basic mode $V^m(k)=(V_0^m, 0, \ldots, 0)^T$, a first basic mode $V^m(k)=(0, V_1^m, 0, \ldots, 0)^T$, or a first circular mode $V^m(k)=(0, V_1^m, 0, \ldots, 0, V_{n-1}^m)^T$, respectively. The respective FMDs can be expressed as:

$$I^m(k) = \begin{pmatrix} V_0^m/Z^g \\ 0 \\ \cdots \\ 0 \end{pmatrix}, I^m(k) = \begin{pmatrix} 0 \\ V_1^m/(\psi_1 + Z^g) \\ 0 \\ \cdots \\ 0 \end{pmatrix}, \qquad [15]$$

or $$I^m(k) = \begin{pmatrix} 0 \\ V_1^m/(\psi_1 + Z^g) \\ 0 \\ \cdots \\ 0 \\ V_{n-1}^m/(\psi_{n-1} + Z^g) \end{pmatrix}.$$

Here, $V_1^m = V_{n-1}^m$ and $\psi_1 = \psi_{n-1}$, and the source impedance $Z^g$ is 50Ω.

When the power sources each have the same amplitude and zero phase, the FMD may become a 0th basic mode, even if the VSA is tuned to a first circular mode. However, the transmitting energy can be confined between the conductive strips and the shield, which can lead to very poor power delivery efficiency. For more efficient transmission, power sources may either each have a constant amplitude and linearly increasing phases in one period (in a first basic mode), or have one period of sinusoidally distributed amplitudes and zero phases (in a first circular mode).

In more complex configurations, a specific FMD Im(k) can be obtained using a power source array by applying the inversion of Eq. [12]. Any mode combination or degeneration in an FMD may be generated independently of which IMD the VSA is tuned to in the transmit stage. However, the IMD may have an important effect on the field pattern and transmitting power efficiency.

The power deposition at one port (q=0) of a VSA (which may not be the same as the power deposition in samples) can be expressed in either port space or mode space as:

$$P = I(p)^T V(p) = I^m(k)^T V^m(k) = (\Psi + Z^g)^{-1} V^m(k)^2 \qquad [16]$$

It may not be clear whether a decoupled VSA or a coupled VSA is more power efficient. In certain modes, a decoupled VSA may be more efficient, whereas in other modes, a coupled VSA may be more efficient.

For example, when a decoupled VSA is used to generate a first basic mode, from reference port q=0, $Z_r(p)=(Z_{00}, 0, \ldots, 0)^T$ and its IMD $\psi^d=(Z_{00}, Z_{00}, \ldots, Z_{00})^T$. The port impedance has to match the power amplifier output impedance, such that $Z_{00}=Z^g$. Thus, from Eq. [16], the power deposition can be expressed as:

$$P_1|_{decoupled} = (V_1^m)^2/(2Z_{00}).$$ [17]

If the coupled VSA, tuned to its first circular mode, is used to generate a first basic mode, then from reference port q=0 it may follow that $Z_r(p)=(Z_{00}, \ldots, Z_{00}\cos(2\pi p/n), \ldots, Z_{00}\cos(2\pi(n-1)/n))^T$, and the corresponding IMD may be expressed as $\psi^d=(0, (n/2)Z_{00}, 0, \ldots, 0, (n/2)Z_{00})^T$. Applying Eq. [16], the power required by the coupled VSA can be provided as:

$$P_1|_{1st\_circular} = (V_1^m)^2/((n/2+1)Z_{00}).$$ [18]

Comparing Eqs. [17] and [18], the power delivered to the coupled VSA can be related to the power delivered to a decoupled VSA by a factor of 2/(n/2+1). For example, the power needed for a decoupled four-element VSA can be 2/3 of the power needed for a coupled four-element VSA. This power ratio becomes 2/9 for a 16-element VSA. The difference in power efficiency for a four-element VSA may not be significant, but it becomes more significant when the number of elements increases.

A coupled VSA tuned to the first circular mode may have a lower power efficiency when generating the first and (n−1)$^{th}$ basic modes. However, it may be more efficient when generating other basic modes, such as the 0$^{th}$ and 2$^{nd}$, etc. For these modes, the power requirements for the coupled VSA may be expressed as $$P_{k(k\neq 1,n-1)}|_{1st\_circular} = (V_k^m)^2/Z_{00},$$ [19]

which can be twice as efficient as a corresponding decoupled VSA. However, the power deposition described above refers only to the power deposition on a coil system, and it is likely not related to the flip angle.

In contrast to the transmit stage, the IMD may have a significant effect on the mode distribution, the signal combination, and noise correlation in the receive stage. An analytic relation between the IMD and coupling among the elements of the VSA is expressed in Eq. [3]. Based on this relationship, the coupling may be adjusted appropriately to achieve a desired IMD. The mutual coupling can be adjusted, for example, by inserting capacitors between elements, and/or by varying reflection ratios at either a single end or at both ends of a conductive strip element. The description below describes the latter option.

To quantitatively describe the relationship between the IMD and a reflection at the end of a conductive strip, a mismatch ratio in port-space may be defined as $$\gamma = Z_{00}/Z^P.$$ [20]

The ratio $\gamma$ may have either a positive value or a negative value. The relationship between the field pattern and the mismatch ratio suggests certain novel modes that may be useful, and it also provides the conditions usable for a decoupled mode, an under-decoupled mode, and an over-decoupled mode. The under-decoupled mode and over-decoupled mode are described in more detail below, together with their roles in parallel imaging.

A single-end mismatch may refer to a configuration where only one end of each conductive strip is mismatched by having a different termination impedance. If each port is matched to $Z_{00}$ in either a coupled VSA or a decoupled VSA, but the impedance transformed to the ports by a transmission line from a low input impedance of the preamplifiers is not equal to $Z_{00}$, then the VSA may be a single-end mismatched VSA. A single-end strong mismatch in a weakly coupled array may result in further decoupling of the array. Alternatively, such mismatch in a strongly coupled VSA that is tuned to its first circular mode can lead to three different results: a decoupled mode, an under-decoupled mode, or an over-decoupled mode.

An n-element VSA may be tuned to its first circular mode, with each port being matched to $Z_{00}$. For this configuration, $Z_r(p)=(Z_{00}, \ldots, Z_{00}\cos(2Bp/n), \ldots, Z_{00}\cos(2\pi(n-1)/n))^T$ and the IMD may be expressed as $\psi^d(k)=(0, (n/2)Z_{00}, 0, \ldots, 0, (n/2)Z_{00})^T$, where $\psi_1=\psi_{n-1}=(n/2)Z_{00}$. Based on the extended IMD diag$\{\psi+Z^P\}$ and Eq. [20], a mode-space mismatch ratio may be defined as the ratio of $\Gamma=$diag$\{\psi+Z^P\}/Z^P$. The first or (n−1)$^{th}$ mode-space mismatch ratio may be provided as:

$$\Gamma_1 = \frac{\psi_1 + Z^P}{Z^P} = 1 + \frac{(n/2)\gamma Z^P}{Z^P} = 1 + \frac{n\gamma}{2}.$$ [21]

In this exemplary case, $\gamma$ again may have a positive or a negative value. If $\Gamma_1=1$, the VSA may be in a decoupled mode. (Although $\Gamma_1$ cannot be equal to 1 in this case, it can approach that value when n and $\gamma$ are both small.) When $\Gamma>0$, the VSA may be in an over-decoupled mode. In this exemplary configuration, the B1 field sensitivity of each conductive strip may be similar to that of the decoupled mode, and a high sensitivity region may be present near the conductive strip. When $\Gamma<1$, the VSA may be in an under-decoupled mode, and there can be a dark hole in the corresponding sensitivity map. If $\Gamma<0$ in an under-decoupled mode, the dark hole may be near the conductive strip. This result may be viewed as a difference between a homogeneous mode (the first circular mode) and a decoupled mode (the phased array mode). These sub-category modes, referred to herein as reverse-decoupled modes, can be important for parallel imaging.

Figure 3:
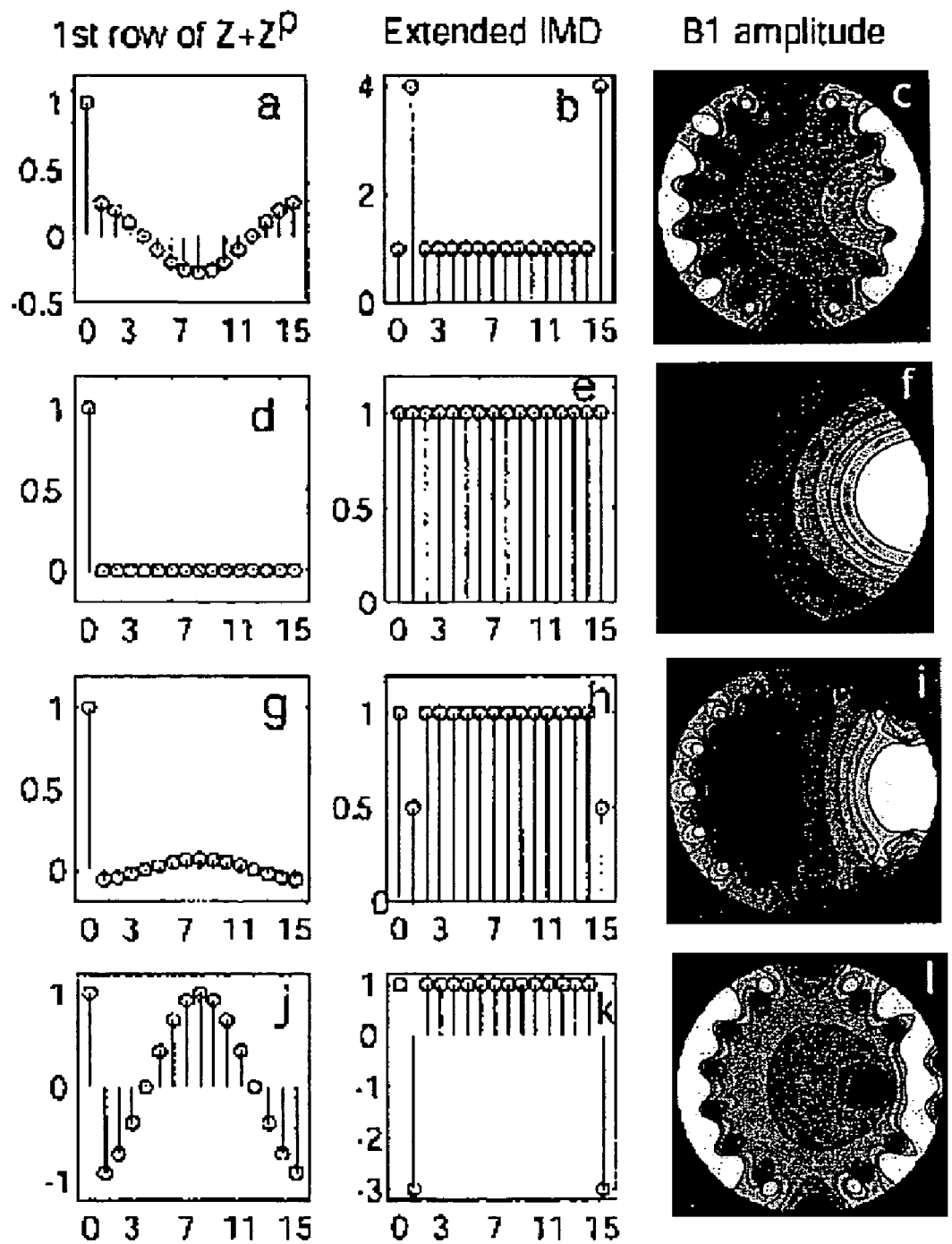
FIG. 3(a) is an exemplary graph of the first row of an impedance matrix $Z+Z^P$ for an over-decoupled mode with $\Gamma=4$.
FIG. 3(b) is an exemplary graph of the extended intrinsic mode distribution corresponding to the over-decoupled mode of FIG. 3(a)
FIG. 3(c) is an exemplary magnetic field B1 map corresponding to the over-decoupled mode of FIG. 3(a)
FIG. 3(d) is an exemplary graph of the first row of the impedance matrix $Z+Z^P$ for a decoupled mode with $\Gamma=1$.
FIG. 3(e) is an exemplary graph of the extended intrinsic mode distribution corresponding to the decoupled mode of FIG. 3(d)
FIG. 3(f) is an exemplary magnetic field B1 map corresponding to the decoupled mode of FIG. 3(d)
FIG. 3(g) is an exemplary graph of the first row of the impedance matrix $Z+Z^P$ for an under-decoupled mode with $\Gamma=0.5$.
FIG. 3(h) is an exemplary graph of the extended intrinsic mode distribution corresponding to under-decoupled mode of FIG. 3(g)
FIG. 3(i) is an exemplary magnetic field B1 map corresponding to the under-decoupled mode of FIG. 3(g)
FIG. 3(j) is an exemplary graph of the first row of the impedance matrix $Z+Z^P$ for a reverse-decoupled mode with $\Gamma=-3$.
FIG. 3(k) is an exemplary graph of the extended intrinsic mode distribution corresponding to the reverse-decoupled mode of FIG. 3(j)
FIG. 3(l) is an exemplary magnetic field B1 map corresponding to the reverse-decoupled mode of FIG. 3(j)

FIG. 3 shows simulation results for an exemplary VSA having 16 elements (n=16). The cylindrical surface where the conductive strips are located has a radius of 12.6 cm, the cylindrical shield has a radius of 15.2 cm, and the length of the conductive strips is 30 cm. FIGS. 3(a)-(c) show results for an exemplary over-decoupled mode with $\Gamma=4$. FIG. 3(a) shows the normalized first row of $Z+Z^P$. FIG. 3(b) shows the exemplary extended IMD, and the exemplary amplitude of the corresponding B1 field map is shown in FIG. 3(c). Simulation results for an exemplary decoupled mode (with $\Gamma=1$) are shown in FIGS. 3(d)-(f). Simulation results for an exemplary under-decoupled mode with $\Gamma=0.5$ are presented in FIGS. 3(g)-(i). Simulation results for an exemplary reverse-decoupled mode (which can be a type of under-decoupled mode) with $\Gamma=-3$ are illustrated in FIGS. 3(j)-(l).

The utilized equations suggest that a single-end mismatched VSA cannot achieve a decoupled mode, but a double-end mismatched VSA may do so. A double-end mismatch can be understood to refer to a configuration where each element of the VSA is terminated with $Z^P$ at the port connected to a receiver, and is also terminated with $Z_L$ on the other end of each conductive strip, where neither $Z^P$ nor $Z_L$ is equal to $Z_{00}$.

The impedance matrix of a VSA that is converted from a single-end mismatch to a double-end mismatch may change from an n×n matrix Z to a 2n×2n matrix $\tilde{Z}$, where $$\tilde{Z} = \begin{pmatrix} Z & Z' \\ Z' & Z \end{pmatrix}, \quad [22]$$

In the present exemplary case, Z can be viewed as a reflection impedance matrix that may be the same as the impedance matrix of a single-end terminated VSA, and Z' can represent a transmission impedance matrix. Both Z and Z' may be circulant matrices, which may be diagonalized to ψ and ψ', respectively, by a digital Fourier transformation matrix. The impedance matrix observed at the ports can be expressed as Z−Z' $(Z+Z_L)^{-1}$Z', and the corresponding diagonalized matrix may be provided as:

$$\psi - \psi'(\psi + Z_L)^{-1}\psi'. \quad [23]$$

The relationship between the first row of Z and of Z', including $Z_r(p)$ and $Z'_r(p)$, may be the same as the relationship between refection coefficients and transmission coefficients in a 2n port system. Therefore, if the $Z_r(p)$ and $Z'_r(p)$ terms are normalized to $z'_r(p)$ and $z'_r(p)$, respectively, then $$(z_r(p))^2 + (z'_r(p))^2 = 1. \quad [24]$$

For the VSA that is tuned to the first circular mode, $z_r(p)=(1, \cos(2\pi/n), \ldots, \cos(2\pi p/n), \ldots, \cos(2\pi(n-1)/n))$ and $z'_r(p)=(0, \sin(2\pi/n), \ldots, \sin(2\pi p/n), \ldots, \sin(2\pi(n-1)/n))$.

For the VSA that is tuned to the first circular mode and is in a double-end mismatched configuration, the extended IMD can be derived from Eqs. [13], [23], and [24] above to yield:

$$\begin{pmatrix} Z^p & 0 & 0 & \cdots & 0 & 0 \\ 0 & Z^p + \psi_1 + (\psi_1)^2/(\psi_1 + Z_L) & 0 & \cdots & 0 & 0 \\ 0 & 0 & Z^p & \cdots & 0 & 0 \\ \cdots & \cdots & \cdots & \cdots & \cdots & \cdots \\ 0 & 0 & 0 & \cdots & Z^p & 0 \\ 0 & 0 & 0 & \cdots & 0 & Z^p + \psi_1 + (\psi_1)^2/(\psi_1 + Z_L) \end{pmatrix} \quad [25]$$

Based on the form of Eq. [25], if $Z_L = -2\psi_1$, the double-end mismatched VSA may become totally degenerate or decoupled. With $\psi_1 = (n/2)Z_{00}$, the condition for a VSA in decoupled mode is $$Z_L = -nZ_{00}. \quad [26]$$

This result indicates that a decoupled mode can be achieved when the mismatch ratio at the far end of a conductive strip is −n.

With more elements present, either approaching a decoupled mode with a single-end mismatch or achieving a decoupled mode with a double-end mismatch may require a higher mismatch ratio.

EXAMPLES

An exemplary 16-element transmit/receive VSA was constructed, tuned, and matched to various modes. A 16-channel transmit/receive RF interface was also constructed so that the VSA may be used in conjunction with a commercial MRI scanner. The S-parameter measurements from a network analyzer verified theoretical predictions, as described in further detail below. Parallel MRI experiments on a phantom indicated that a 16-element VSA can achieve reduction by a factor of 16 (4×4) in a reversed decoupled mode (RDM), and better performance was observed in the central region of the field of view (FOV).

Described herein in further detail are an exemplary embodiment of a 16-channel transmit/receive VSA and a 16-way transmit/receive RF interface in accordance with the present invention. S-parameter and impedance measurements may be conducted to corroborate portions of the invention described herein. MR phantom imaging using the 16-ch VSA system demonstrate the existence of a reverse-decoupled mode as predicted by the theoretical analyses described herein, and also demonstrate certain advantages in using such a mode in a parallel MRI scanner.

Figure 4:
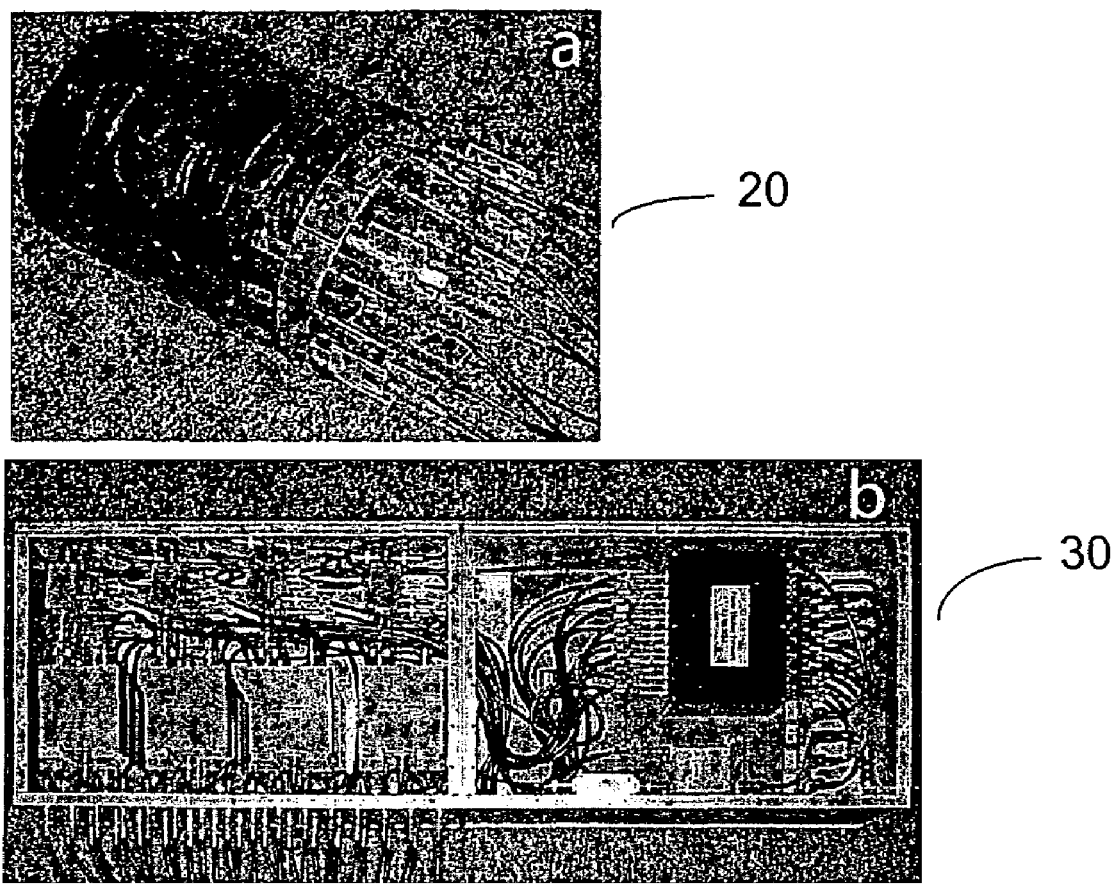
FIG. 4(a) is a photograph of an exemplary 16-element volume strip array (VSA) with 16 connecting cables and 16 baluns according to certain exemplary embodiments of the present invention.
FIG. 4(b) is a photograph of the exemplary 16 channel transmit/receive RF front-end according to certain exemplary embodiments of the present invention, which includes 16 TR switches, a 1-to-16 power splitter, a 16-way phase shifter, and 17 bias-Ts.

The exemplary 16-element prototype VSA may be constructed using two concentric plastic tubes. This exemplary VSA 20 is shown in FIG. 4(a). An outer tube having an OD of 12", a ¼" wall thickness, and a length of 15", may be fixed to an inner tube having an OD of 10", a ¼" wall thickness, and a length of 13" using 32 plastic blocks, with 16 blocks attached at each end of the tubes. Sixteen copper strips, each ½" wide and 12" long, may be equally spaced around the outer surface of the inner tube. A sheet of copper foil may be applied to the outer surface of the outer tube, to function as an RF shield and a ground. The shield may be segmented to limit eddy current effects. A ground may be provided to the circuitry inside of the outer tube by 32 brass screws, which also attaches to the outer tube to the 32 plastic blocks.

An apparatus (e.g. a surface mount assembly containing a bulk-head may be embedded in each of the 32 plastic blocks. Such apparatus may be configured as an RF port at the front end of the tube. Such apparatus may also be used as "enable" switches at the far end of the tube. When the "enable" switch is closed to connect to a short end-cap, the element associated with the "enable" switch may function as a resonator. Alternatively, with the "enable" switch open, the corresponding element may be an open circuit. (See, e.g., circuit 15 of FIG. 1(b)). A capacitor and a trimmer (obtained from Voltronics, Denville, N.J.), shunted to ground for tuning, can be provided at both ends of each conductive strip; and a capacitor can also provided at the middle of each conductive strip to allow matching.

A 16-way transmit/receive RF front-end 30 may be assembled as shown in FIG. 4(b). In a transmit path, an RF signal together with a 5 A, 5V DC bias may share the same cable. These signals may first be directed through a bias-T to separate the RF signal and the DC bias. The RF signal may then be directed through a 16-way power splitter (obtained from Taylor Microwave, Inc., Clifton, N.J.) and split into 16 transmit sources. The DC bias may also split into 16 separate DC biases. Each of the 16 RF sources may then be routed through a phase shifter and another bias-T to achieve the desired phase and DC bias, and then into one of 16 head TR switches (obtained from Netcom, Inc., Wheeling, Ill.). A+5V, 0.6 A DC bias may be configured to set the TR switch into a transmit mode, and 16 independent power sources may be delivered to 16 elements in the VSA. During the transmit mode, all TR switches may be observed to have an insertion loss of −0.1 dB between the transmit port and the coil port of the TR switch, and isolation between the transmit port and the receive port of the TR switch may be observed at approximately −63 to −64 dB. During the receive mode, the observed insertion loss between the coil and the preamplifier may be approximately −0.18 to −0.25 dB.

The VSA and the RF front-end may be connected to a 1.5 T MRI scanner (obtained from GEMS, Milwaukee, Wis.). Four four-channel receivers may be chained together and synchronized as a 16-channel receiver which may receive signals from 16 low input impedance preamplifiers (obtained from Netcom, Inc., Wheeling, Ill.), and which may also provide a DC bias for the preamplifiers and coils. Both sequential and parallel imaging may be performed using this setting.

Many natural and mixed modes of the VSA may be been tuned to the MRI resonance frequency at 1.5 T. Details that are provided herein are only for the first circular mode and reverse decoupled mode cases. Capacitors C1, C2 and C3 (see circuit of FIG. 1(b)) may have a capacitance of 91 pF, 75 pF and 51 pF, respectively, for each element. The first circular mode of each conductive strip may be tuned to 70.3 MHz with trimmers, with the tuning performed while all other strips may be disabled. Each port of the coupled VSA may be tuned to 63.96 MHz without loading and with all elements simultaneously enabled, and to 63.88 MHz when loaded with a human head. The impedance of each port may be observed to be 153Ω when the VSA is unloaded, and 52Ω when loaded, which indicates that the loading factor is approximately 3.

Figure 5:
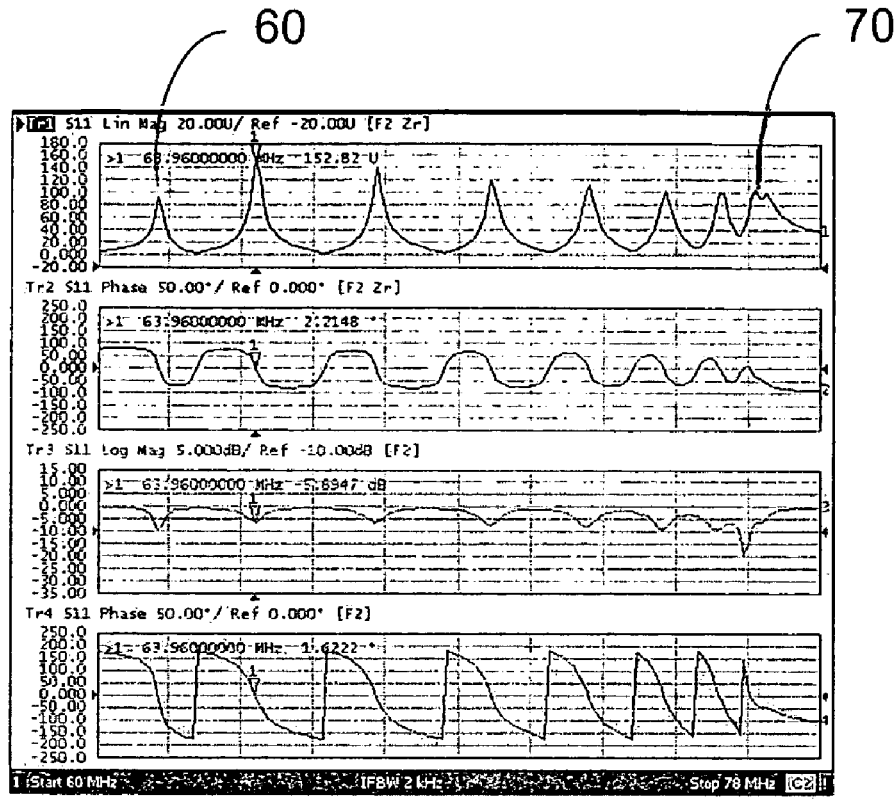
FIG. 5(a) is plot of exemplary measurements of the impedance amplitude, impedance phase, S11 amplitude, and S11 phase for one port of an unloaded VSA measured by the network analyzer.
FIG. 5(b) is plot of exemplary measurements of impedance amplitude, impedance phase, S11 amplitude, and S11 phase for one port of a loaded VSA measured by a network analyzer.
Figure 5:
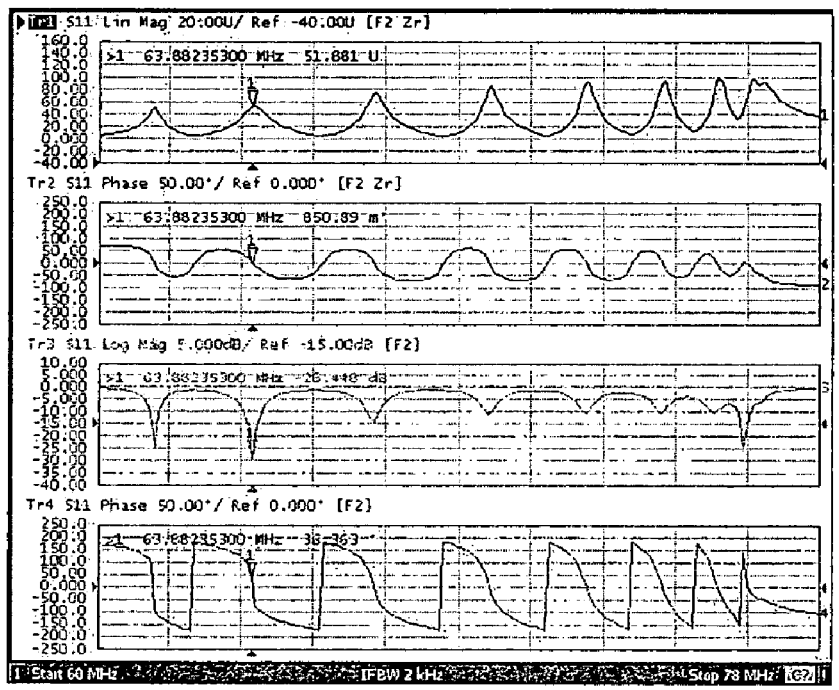

The exemplary magnitude and phase of the unloaded reflection impedance ($Z_{00}$) and reflection ($S_{11}$) of each port of the VSA are shown in FIG. 5(a). Corresponding measurements may be taken with the VSA being loaded with a human head are shown in FIG. 5(b). The nine natural modes may be be clearly distinguished in the impedance spectrums. The first peak from left 60 in FIG. 5(a) may indicate the 0th basic mode. The second through the seventh peaks in this figure may represent the first to 7th circular modes, and the rightmost peak 70 represents the 8th basic mode. The plots shown in FIG. 5 can indicate that in the frequency range of about 60 MHz to 78 MHz, the loading factor for the first circular mode appears to be significant, whereas the loading factors for the higher modes appear to be unimportant. The data shown in the exemplary graphs of FIGS. 5(a) and 5(b) may be measured on a four-port network analyzer E5070B (e.g., obtained from Agilent Technologies, Englewood, Colo.).

Transmission impedance values may be calculated using the S-parameters S11, S12, S21, and S22 from measurements taken at two ports under two different conditions. See, e.g., Pozar D M, *Microwave Engineering*, New York, John Wiley & sons, Inc.; 1998. Under the first set of conditions, the two ports of the VSA being tested communicate with a 50Ω impedance from the two test ports of the network analyzer. Under the second set of conditions, the two ports of the VSA being tested communicate with a 1000Ω impedance which is matched from the 50Ω impedance of two test ports of the network analyzer.

Figure 6:
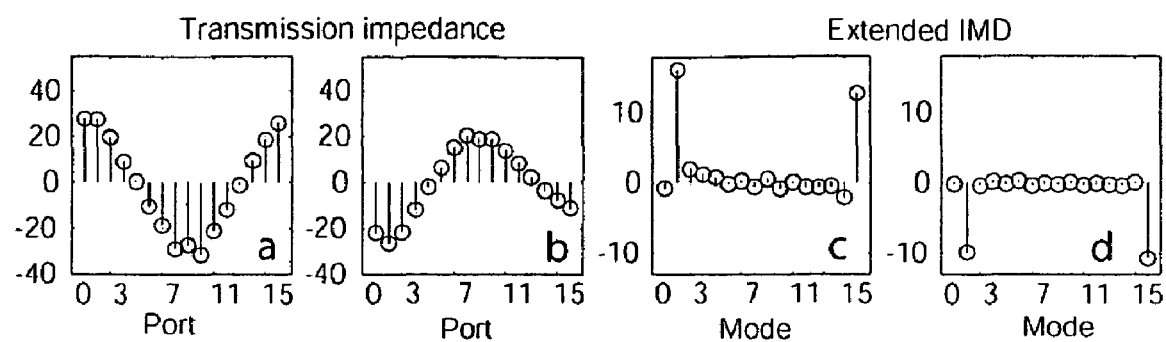
FIG. 6(a) is an exemplary plot of the real part of $Z_r(p)$ in port-space for a 16-element VSA
FIG. 6(b) is an exemplary plot of the imaginary part of $Z_r(p)$ in port-space for a 16-element VSA.
FIG. 6(c) is an exemplary plot of the real part of the IMD diag $\{\psi+Zg\}$ in mode-space for a 16-element VSA.
FIG. 6(d) is an exemplary plot of the imaginary part of the IMD diag $\{\psi+Zg\}$ in mode-space for a 16-element VSA.

The first set of conditions can be equivalent to a transmit stage. FIGS. 6(a) and 6(b) show graphs of the real and imaginary parts, respectively, of $Z_r(p)$ in port-space for such a configuration. FIGS. 6(c) and 6(d) show graphs of the real and imaginary parts, respectively, of the corresponding extended IMD diag $\{\psi+Z^g\}$ in mode-space.

Figure 7:
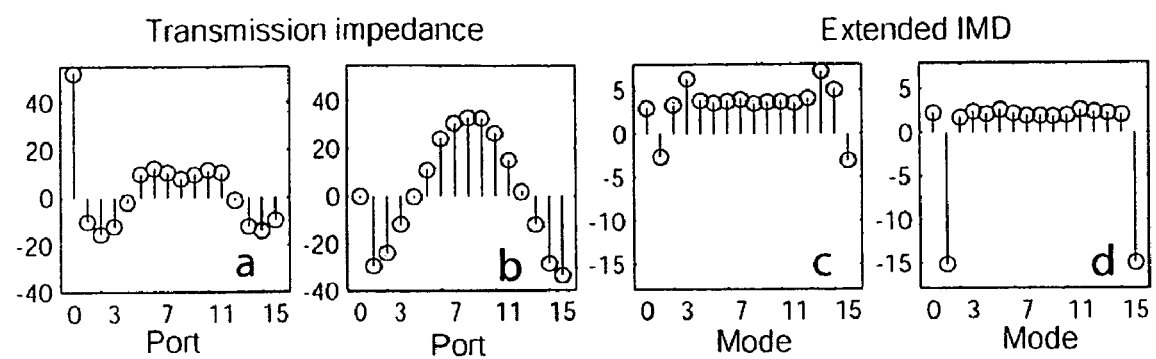
FIG. 7(*d*) is a further exemplary plot of the imaginary part of the IMD diag {ψ+Zg} in mode-space for a 16-element VSA.

The second set of conditions can be equivalent to a receive stage, where the low input impedance of the preamplifier can be transformed to a high impedance by a quarter wavelength transmission line ($Z^P=1$ kΩ). FIGS. 7(a) and 7(b) show graphs of the real and imaginary parts, respectively, of $Z_r(p)$ in port-space for this set of conditions, and FIGS. 7(c) and 7(d) show graphs of the real and imaginary parts, respectively, of the corresponding extended IMD diag $\{\psi+Z^P\}$ in mode-space. The exemplary test measurement results shown in FIGS. 7(a)-7(d) indicate that a reverse-decoupled mode may exist, and that its extended IMD may be the same as that predicted by the theoretical analysis described above.

Figure 8:
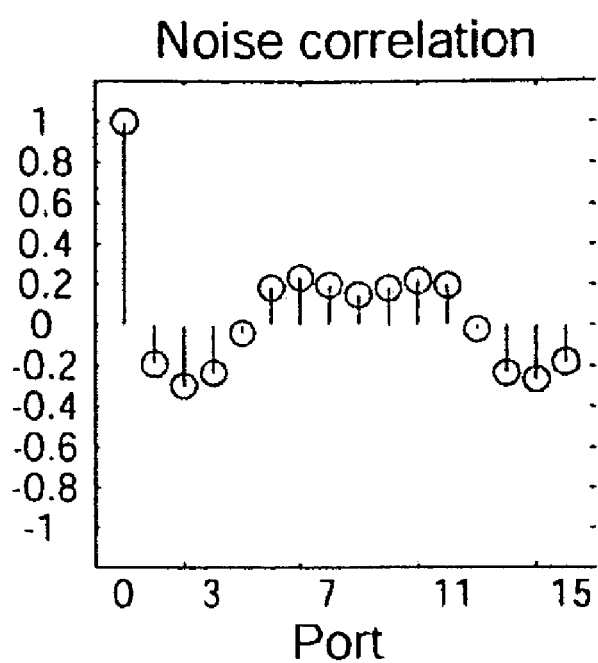
FIG. 8 is an exemplary plot of a noise correlation for a 16-element VSA.

A noise correlation can be estimated from the normalized real part of the transmission impedance, as shown in FIG. 8. The measured values in this exemplary plot are 1.0, −0.19, −0.30, −0.23, −0.04, 0.18, 0.23, 0.19, 0.15, 0.18, 0.22, 0.20, −0.02, −0.23, −0.27, and −0.18, respectively. Although noise correlation between elements appears to be fairly high, many of them have opposite phases. Therefore, a significant portion of the correlated noises may be cancelled. The sum of all the mutual noise terms shown in FIG. 8 may be about −0.10, indicating that the noise coupled from other conductive strips may beonly about −20 dB, which may not be a significant level.

Figure 9:
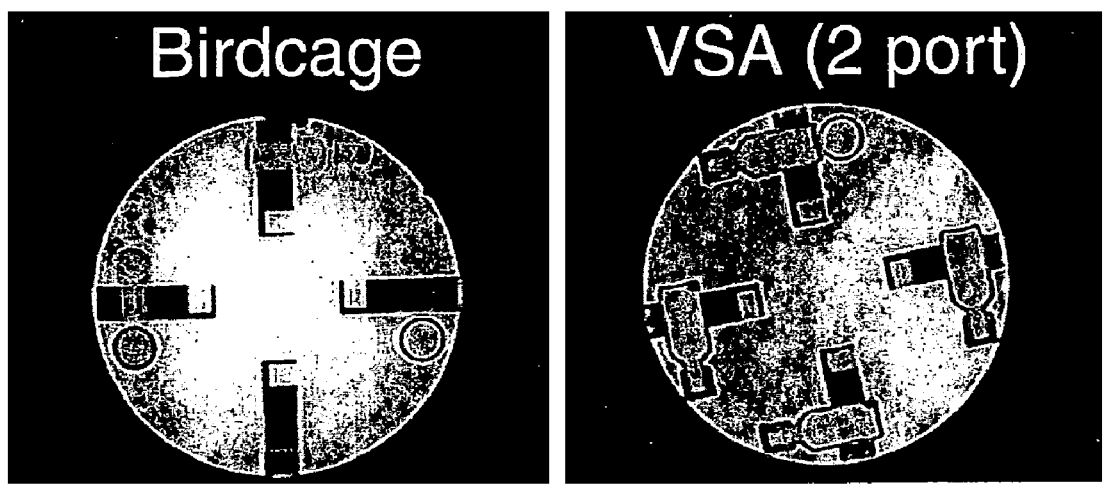
FIG. 9(*a*) shows an exemplary image obtained from a commercial birdcage coil.

The TEM resonator is one exemplary case of a VSA. To demonstrate this, two ports (port 1 and 5) that are 90° apart in both azimuthal angle and electrical phase may be selected from the 16 ports of the VSA. These ports may be directly connected to a quadrature head coil interface with a quarter-wavelength coaxial cable. The homogeneous MR image shown on the right side of FIG. 9 may be acquired using this configuration. The exemplary parameters used may include a gradient echo pulse sequence, a TR or repeat time of 150 ms, TE or echo timeset at minimum full, a 30 cm field of view, NEX or number of excitations equal to 1, a 256×256 data acquisition matrix, and a slice thickness of 5 mm. Comparing these results with the image on the left side of FIG. 9, which may be obtained using GE's commercial birdcage head coil with the same pulse sequence and scan parameters, a slight SNR reduction may be seen in the two-port VSA image. This result may be attributed to a shield effect.

The reverse-decoupled mode predicted by the theoretical analysis described above may be observed using MRI, as shown in FIG. 10. In this experiment, sixteen quarter-wavelength coaxial cables, each having one balun attached, may be connected between the ports of the VSA and the preamplifiers. Because the input impedances of the preamplifiers may be very low, the quarter-wavelength cables, may transform them into very high impedances at the VSA ports. The combination of the negative cosine current distribution and the high impedances at the ports may be observed to produce a reverse-decoupled mode. A dark hole in front of each element, predicted for this mode, may be visible in these images.

Figure 10:
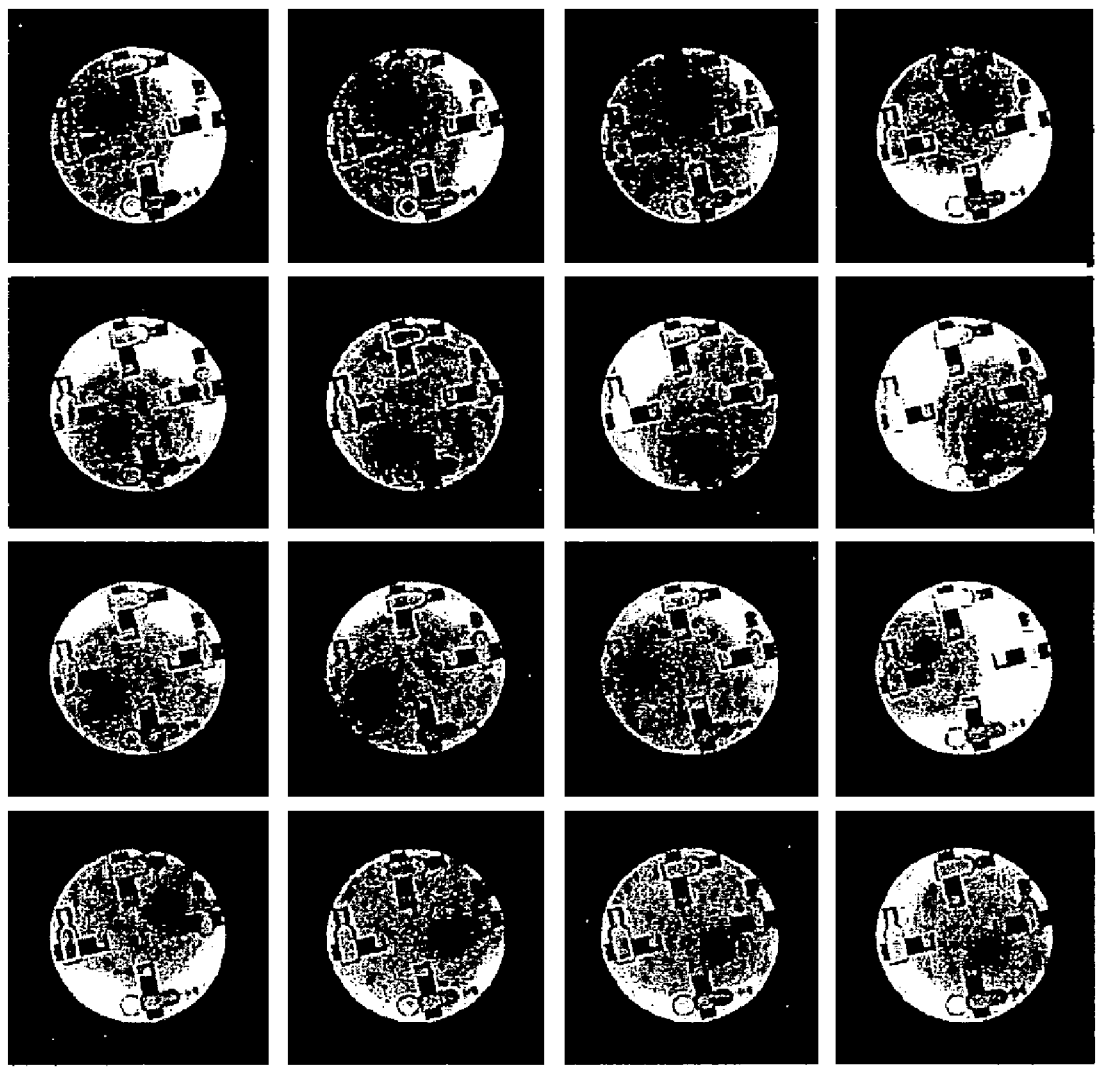
FIG. 10 is an exemplary set of images that indicate the existence of a reverse-decoupled mode obtained using MRI with the 16 element transmit/receive VSA, where the exemplary images are obtained simultaneously from 16 conductive strips.

The pulse sequence and the scan parameters for obtaining the images shown in FIG. 10 may be the same as those listed above for the TEM resonator configuration. However, in this example the transmit port of the 16-way RF front-end can be directly connected to the output of the 20 kW body power amplifier. Using a manual prescan, the power required for a 90° flip angle is TG or transmit gain may be equal to 30, which may confirm the value predicted by application of Eq. [18]. The 16 transmit channels, after being directed through a 0° 1-to-16 power splitter, may be routed through a linear 16-phase shifter array, where the phase shift ranges from −180° to 180° in increments of 22.5°, to generate a first basic mode during the transmit stage.

A reversed-decoupled mode may provide certain advantages for parallel imaging applications. Each separate channel can have a high signal-to-noise ratio and a distinct phase in the central region of the field of view. This configuration may avoid the shortcomings of a decoupled phased array which can have a relatively low signal-to-noise ratio and a poor g-factor in the central region.

Figure 11:
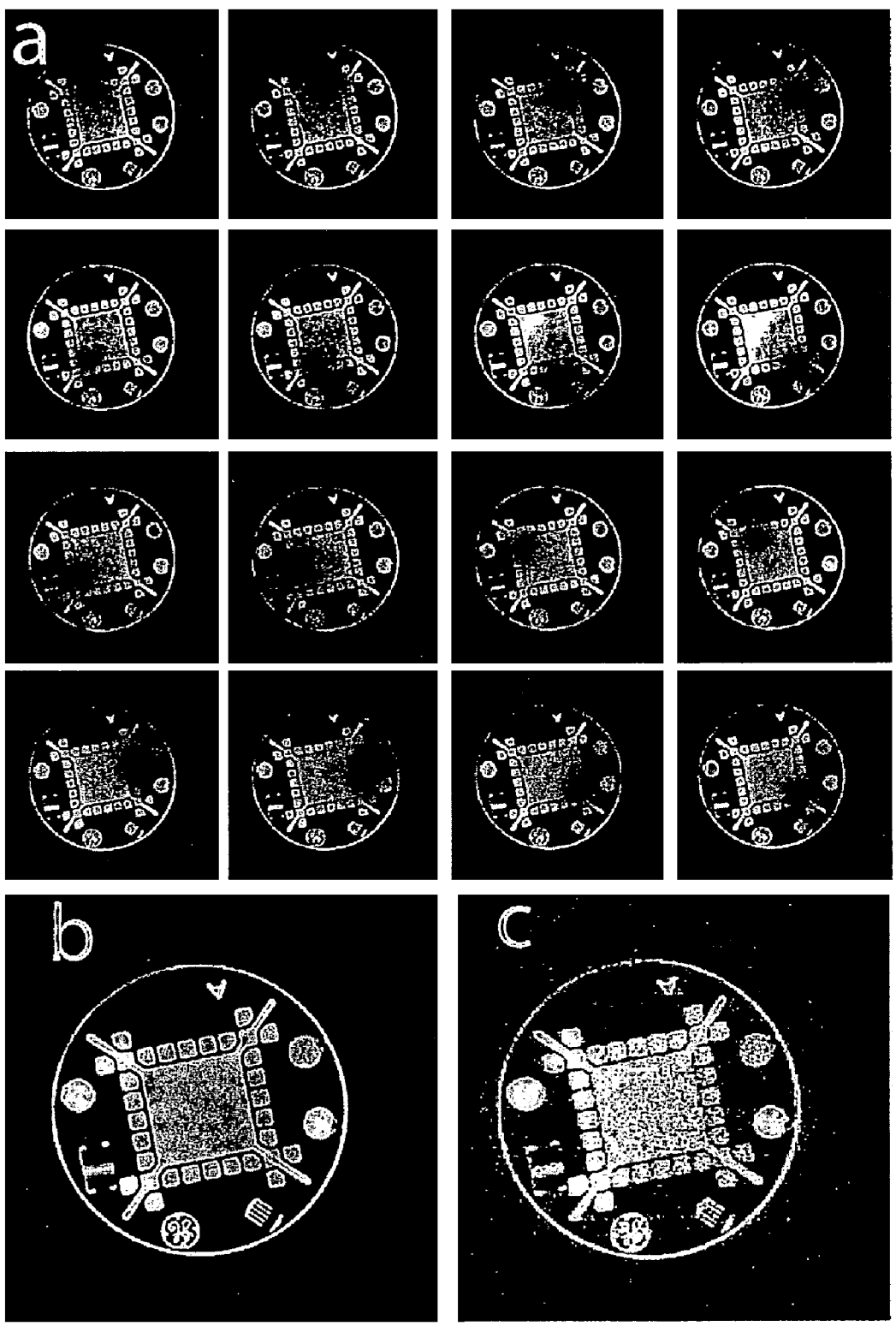
FIG. 11(*a*) is an exemplary set of sensitivity maps obtained from all channels of the 16-element VSA operating in a reverse-decoupling mode that may be used for parallel imaging.

The VSA configured in a reverse-decoupled mode may be used for 16-channel simultaneous data acquisition to demonstrate its feasibility for parallel imaging. The pulse sequence used may be a Fast Gradient Echo, a TR or repeat time of 200 ms, a TE or echo time of 5 ms, a 20 cm field of view, NEX or number of excitations equal to 1, and a 5 mm slice thickness. FIG. 11(a) shows the sensitivity profiles of the 16-channel VSA. FIG. 11(b) shows the image which may be derived by a non-parallel reconstruction, using the root of the sum of the squares. FIG. 11(c) shows the image which may be derived by a parallel reconstruction with a reduction factor of 16, (for sampling along two dimensions, where the reduction factor for each dimension is four). The parallel reconstruction may be performed using a General Encoding Method (GEM). See, e.g., Sodickson D K and McKenzie C A, "A generalized approach to parallel magnetic resonance imaging," *Medical Physics* 2001, 28:1629-1643.

Figure 12:
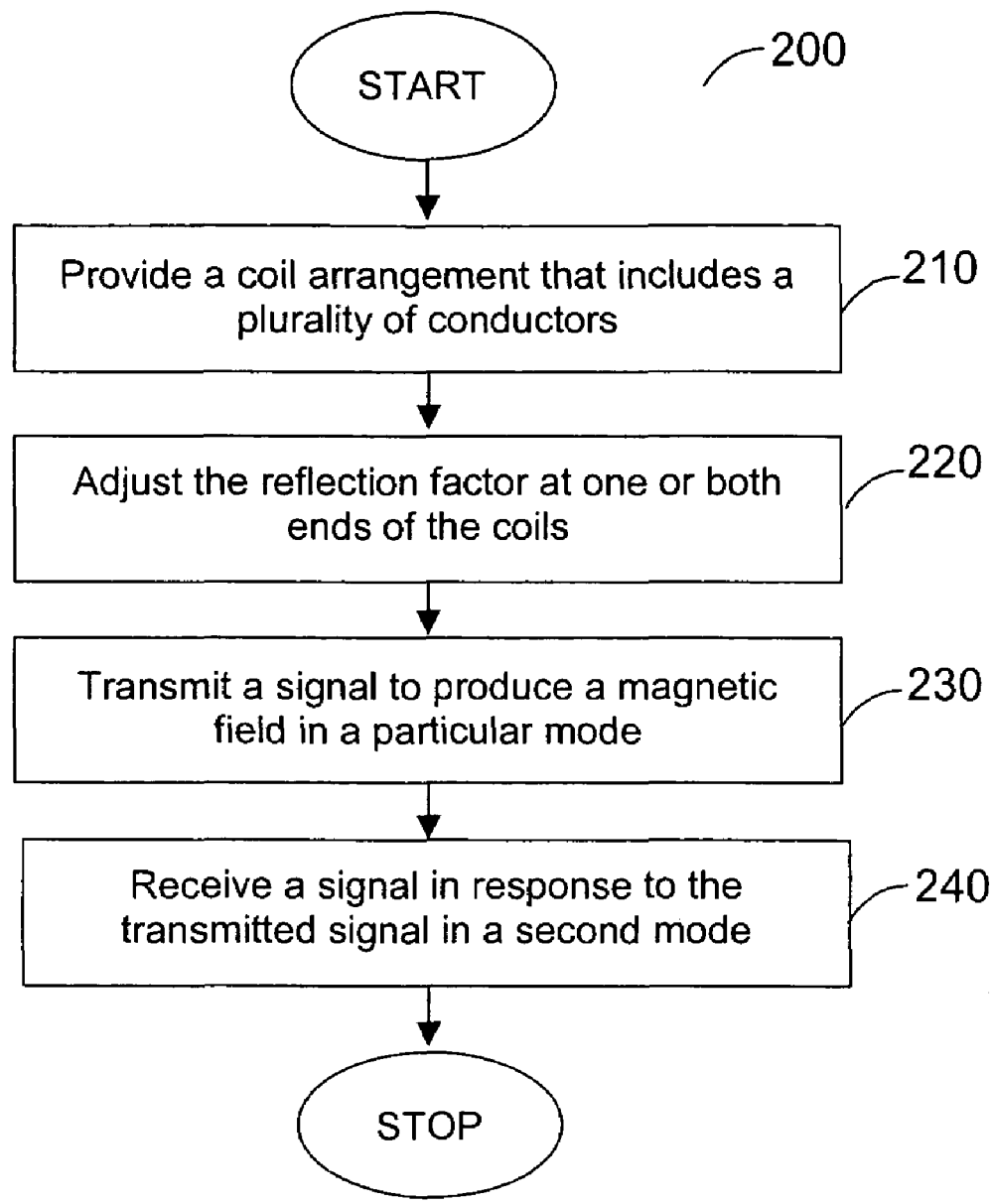
FIG. 12 is a flow diagram of an exemplary embodiment of a method according to the present invention.

An exemplary flow diagram of the method 200 according to certain embodiments of the present invention is shown in FIG. 12, which provides the exemplary steps that may be used to generate and receive signals for use, e.g., in magnetic resonance imaging applications. In particular, a coil arrangement that can include a plurality of conductors may be provided (step 210). The arrangement may be in the form of a volume strip array (VSA) as described above. The coil arrangement may also include one or more configurable conductor ends, which can be adjusted to vary a reflection factor or other electromagnetic property related to signal transmission and reception. The reflection factor may adjusted at one or both ends of one or more coils or conductors (step 220) to produce desired transmit and receive modes. These modes can be coupled, uncoupled, and/or totally decoupled. The mode for transmitting signals may be the same as or different than the mode for receiving signals. A signal may then be transmitted (step 230), which can cause a magnetic field to be produced. The coil arrangement may then be used to receive a signal that is at least partially in response to the transmitted signal (step 240). The procedure may then be stopped, and the received signals may optionally be analyzed if desired to obtain information about the medium through which the signals have passed.

The mixed mode VSA (a coupled phased array) described herein may provide a new category of MRI RF coil design, as suggested by both theoretical analysis and experimental results. This VSA can be based on an understanding that combines aspects of a birdcage configuration, a TEM resonator, and a phased array. The VSA described herein may provide new ways to address RF coil deficiencies and shortcomings, particularly in parallel MRI and high field MRI.

A particular mode of the VSA, referred to as a reverse-decoupled array, was predicted using a mixing mode theory. The existence of this mode has been verified through experiments using both MR imaging and test instrument measurements. The advantages of a VSA in this mode include a high signal-to-noise ratio and a low g-factor in the central region of the field of view, and cancellation of a significant amount of correlated noise. MRI results indicate that a 16-channel VSA in reverse-decoupled mode can achieve a 16×(4×4) reduction factor without any aliasing.

Other mixed modes may be used in conjunction with the VSA described above for a variety of technical and clinical purposes in accordance with exemplary embodiments of the present invention. The mixing mode theory and design principles presented herein can allow identification and direct configuration of the VSA to provide such modes for various applications.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. In addition, all publications referenced above are incorporated herein by reference in their entireties.

What is claimed is:

1. An apparatus comprising:
an arrangement comprising one or more coils, at least one of which is configured to be electromagnetically coupled to another coil in an array, wherein the arrangement is configured to transmit a signal to generate a magnetic field in a particular mode and to receive a signal in response to the transmitted signal in a further mode, the further mode is capable of being different from the particular mode, and at least one of the particular mode or the further mode is controllable to be a combination of a plurality of basic modes.

2. The apparatus of claim 1, wherein,
the one or more coils have at least one end; and
the arrangement comprises a control arrangement configurable to adjust a reflection factor at the at least one end for the one or more coils to receive different modes.

3. The apparatus of claim 2, wherein the at least one end is configurable for coupling and decoupling the received signal.

4. The apparatus of claim 3, wherein the at least one end comprises a first end and a second end that are configurable for providing a total decoupled mode for the received signal.

5. The apparatus of claim 2, wherein the control arrangement is configurable to adjust at least one of a phase and an amplitude of the transmitted signal.

6. The apparatus of claim 1, wherein the arrangement is adapted to transmit the signal to generate the magnetic field in the particular mode based at least in part on an amplitude or a phase of the transmitted signal.

7. The apparatus of claim 1, wherein the arrangement includes a plurality of linear conductors, and wherein each conductor is arranged approximately parallel to another one of the conductors.

8. The apparatus of claim 7, further comprising at least one reactive device and a cylindrical conductive shield that is configured to surround at least a portion of the linear conductors to provide a resonant structure that is capable of being tuned to a resonance frequency.

9. An apparatus comprising:
a coil arrangement comprising:
one or more coils, at least one of which is configured to be electromagnetically coupled to another coil in an array, and
one or more conductors, each having at least one end; and a control arrangement configured to transmit a signal using the coil arrangement in a particular mode and to receive a signal in response to the transmitted signal in a further mode, wherein the control arrangement is configured to adjust a reflection factor at the at least one end, the further mode is controllable to be different from the particular mode, and at least one of the particular mode or the further mode is controllable to be a combination of a plurality of basic modes.

10. The apparatus of claim 9, wherein the control arrangement is configured to transmit the signal by controlling at least one of a phase or an amplitude of the signal.

11. The apparatus of claim 9, wherein the control arrangement is configurable to adjust the reflection factor at the at least one end for at least one of coupling or decoupling the received signal.

12. The apparatus of claim 9, wherein the at least one end comprises a first end and a second end, and wherein the control arrangement is configurable for providing a total decoupled mode by adjusting the reflection factor at the first end and the second end.

13. The apparatus of claim 9, wherein an original mode of the received signal is determined at least in part by a mutual coupling between the conductors and the reflection factor at the at least one end of the conductors.

14. A process for detecting a signal, comprising:
transmitting a magnetic field signal in a particular mode using an arrangement comprising one or more coils, at least one of which is configured to be electromagnetically coupled to another coil in an array; and
receiving a response signal in response to the transmitted signal in a further mode, wherein the further mode is capable of being different from the particular mode, and at least one of the particular mode or the further mode is controllable to be a combination of a plurality of basic modes.

15. The process of claim 14, wherein the step of transmitting comprises controlling at least one of a phase or an amplitude on at least one port of a coil arrangement.

16. The process of claim 15, wherein the step of controlling comprises controlling at least one of a phase or an amplitude of the signal on each of a plurality of ports in the coil arrangement.

17. The process of claim 14, wherein the receiving step comprises receiving the response signal in the further mode based at least in part on a reflection factor at a port of a coil arrangement.

18. The process of claim 14, wherein the receiving step comprises receiving the response signal in the further mode based upon a reflection factor provided at an end of a conductor, and wherein the end is configurable to provide at least one of a coupled mode or a decoupled mode.

19. The process of claim 18, wherein the at least one end comprises a first end and a second end that are configurable to provide a total decoupled mode.

20. A process comprising:
receiving a signal in a further mode in response to a transmitted magnetic field signal in a particular mode, using a coil arrangement comprising one or more coils, at least one of which is configured to be electromagnetically coupled to another coil in an array, and at least one conductor having at least one end configurable to adjust a reflection factor at at least a portion of a coil arrangement; and
controlling the reflection factor using the at least one end, wherein the further mode is controllable to be different from the particular mode, and at least one of the particular mode or the further mode is controllable to be a combination of a plurality of basic modes.

21. The process of claim 20, wherein the coil arrangement comprises two or more conductors each with at least one end configurable to adjust the reflection factor at each conductor.

22. The process of claim 20, wherein the at least one end is configurable to create a coupled and a decoupled mode for the received signal.

23. The process of claim 20, wherein the at least one end comprises first and second ends that are configurable to provide a total decoupled mode for the received signal.

24. The process of claim 20, wherein the applying step comprises controlling the reflection factor to provide a mode of the received signal that is at least one of the same as or different from a mode of the transmitted signal.

25. The process of claim 20, wherein the at least one conductor is a linear conductor.

26. The process of claim 25, wherein the coil arrangement comprises a plurality of conductive strips each arranged parallel to another one of the conductive strips, and each having first and second ends configurable to adjust the reflection factor at the ends to control the mode of the received signal.

27. The apparatus of claim 1, wherein the one or more coils comprise a plurality of coil elements configured to be electromagnetically coupled to one another.

28. The apparatus of claim 1, wherein the combination is arbitrary.

29. The apparatus of claim 1, wherein at least one of the particular mode or the further mode is associated with an intrinsic mode distribution.

30. The apparatus of claim 9, wherein at least one of the particular mode or the further mode is associated with an intrinsic mode distribution.

31. The process of claim 14, wherein at least one of the particular mode or the further mode is associated with an intrinsic mode distribution.

32. The process of claim 20, wherein at least one of the particular mode or the further mode is associated with an intrinsic mode distribution.

* * * * *